(12) United States Patent
Lin et al.

(10) Patent No.: US 10,401,432 B2
(45) Date of Patent: Sep. 3, 2019

(54) ROTARY SWITCH STATE DETECTION DEVICE

(71) Applicant: NATIONAL CHUNG SHAN INSTITUTE OF SCIENCE AND TECHNOLOGY, Taoyuan (TW)

(72) Inventors: Yu-Shan Lin, Taoyuan (TW); Jun-Liang Zhu, Hualien County (TW); Tung-Jung Hsu, Taoyuan (TW); Chao-Tse Hong, Taipei (TW)

(73) Assignee: NATIONAL CHUNG SHAN INSTITUTE OF SCIENCE AND TECHNOLOGY, Taoyuan (TW)

( * ) Notice: Subject to any disclaimer, the term of this patent is extended or adjusted under 35 U.S.C. 154(b) by 300 days.

(21) Appl. No.: 15/336,423

(22) Filed: Oct. 27, 2016

(65) Prior Publication Data

US 2017/0328955 A1    Nov. 16, 2017

(30) Foreign Application Priority Data

May 10, 2016 (TW) .............................. 105114355 A (51) Int. Cl.
| | |
|---|---|
| *G01R 31/327* | (2006.01) |
| *G01D 5/14* | (2006.01) |
| *G01V 7/00* | (2006.01) |
| *H01H 19/14* | (2006.01) |
| *G01P 15/18* | (2013.01) |
| *H01H 9/16* | (2006.01) |

(52) U.S. Cl.
CPC ........... *G01R 31/3277* (2013.01); *G01D 5/14* (2013.01); *G01D 5/145* (2013.01); *G01V 7/00* (2013.01); *G01P 15/18* (2013.01); *H01H 9/167* (2013.01); *H01H 19/14* (2013.01)

(58) Field of Classification Search
CPC ...... G01R 31/3277; G01D 5/145; G01D 5/14; G01V 7/00; H01H 19/14; G01P 15/18
See application file for complete search history.

(56) References Cited

U.S. PATENT DOCUMENTS 4,335,611 A * 6/1982 Bennett ................. G01P 15/093
73/514.19
4,481,471 A * 11/1984 Miller ................. G01N 27/9046
324/240

(Continued)

FOREIGN PATENT DOCUMENTS

| WO | WO2011141056 A1 | 11/2011 |
| WO | WO2014154738 A1 | 10/2014 |

*Primary Examiner* — Christopher P McAndrew
*Assistant Examiner* — Zannatul Ferdous
(74) *Attorney, Agent, or Firm* — WPAT, PC (57) ABSTRACT

A rotary switch state detection device includes a magnetic field generating unit, a gravity sensing unit, a magnetic force sensing unit and a processing unit. The magnetic field generating unit generates a magnetic field. The magnetic force sensing unit and the gravity sensing unit are disposed at a rotary switch to detect a gravity value and a magnetic force value of the magnetic field and generate a gravity strength signal and magnetic field strength signal, respectively. The processing unit is connected to the gravity sensing unit and the magnetic force sensing unit to calculate a gravity value variation and a magnetic force value variation and thereby precisely locate a rotation head of the rotary switch upon completion of rotation thereof.

9 Claims, 9 Drawing Sheets

(56) References Cited

U.S. PATENT DOCUMENTS

| | | | |
|---|---|---|---|
| 5,180,892 A * | 1/1993 | Yoshimura | B24B 49/105 |
| | | | 200/61.45 M |
| 6,472,993 B1 | 10/2002 | Addy | |
| 2001/0015090 A1* | 8/2001 | Kolbe | F41A 31/02 |
| | | | 73/35.01 |
| 2002/0011483 A1* | 1/2002 | Kishimoto | H05B 6/666 |
| | | | 219/491 |
| 2007/0132420 A1* | 6/2007 | Lim | B25J 5/007 |
| | | | 318/568.12 |
| 2010/0019902 A1 | 1/2010 | Mullet | |
| 2013/0310711 A1* | 11/2013 | Wang | A61B 5/1121 |
| | | | 600/595 |
| 2015/0217598 A1* | 8/2015 | Dua | B60B 7/006 |
| | | | 301/37.25 |
| 2015/0334206 A1* | 11/2015 | Hung | G06F 1/3278 |
| | | | 709/217 |
| 2015/0340932 A1* | 11/2015 | Hsu | F03G 7/10 |
| | | | 310/68 B |
| 2017/0082132 A1* | 3/2017 | Ota | F16B 35/00 |
| 2017/0160301 A1* | 6/2017 | Donolo | G01P 3/44 |
| 2017/0219119 A1* | 8/2017 | Barton | F16K 31/602 |
| 2017/0227140 A1* | 8/2017 | Barton | F16K 37/0041 |

* cited by examiner (PRIOR ART)
FIG. 1

ROTARY SWITCH STATE DETECTION DEVICE

CROSS-REFERENCE TO RELATED APPLICATION

This non-provisional application claims priority under 35 U.S.C. § 119(a) on Patent Application No(s). 105114355 filed in Taiwan, R.O.C. on May 10, 2016, the entire contents of which are hereby incorporated by reference.

FIELD OF THE INVENTION

The present invention relates to detection devices and, more particularly, to a rotary switch state detection device for determining the operating state of a rotary switch.

BACKGROUND OF THE INVENTION

Rotary switches are widely used in various mechanical apparatuses, such as a gas stove or a microwave oven, to exercise segmented control over the mechanical apparatuses as needed.

Figure 1:
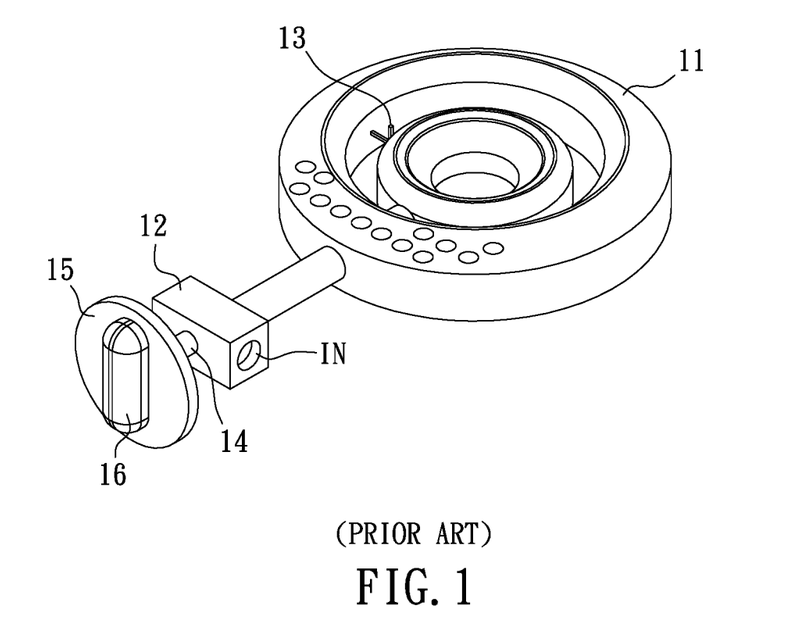
FIG. 1 (PRIOR ART) is a schematic view of a gas stove with a conventional rotary switch.

For example, a rotary switch for use with a gas stove is configured for use in adjusting the flow rate of a fuel gas. Referring to FIG. 1, the gas stove comprises a burner 11, a fuel gas flow rate controller 12, and an ignition device 13. The fuel gas flow rate controller 12 is disposed at a fuel gas inlet IN of the burner 11 and connected to a fuel gas source through a tube. A control level 14 is disposed at the front end of the fuel gas flow rate controller 12. A rotary switch 15 is disposed at one end of the control level 14. The ignition device 13 is positioned proximate to the mouth of the burner 11 and connected to a high-voltage coil disposed at the fuel gas flow rate controller 12. A rotation head 16 of the rotary switch 15 is rotated clockwise or counterclockwise to change the state of the rotary switch 15, so as to adjust the fuel gas flow rate and control the magnitude of the heat emitted from the gas stove.

Figure 2:
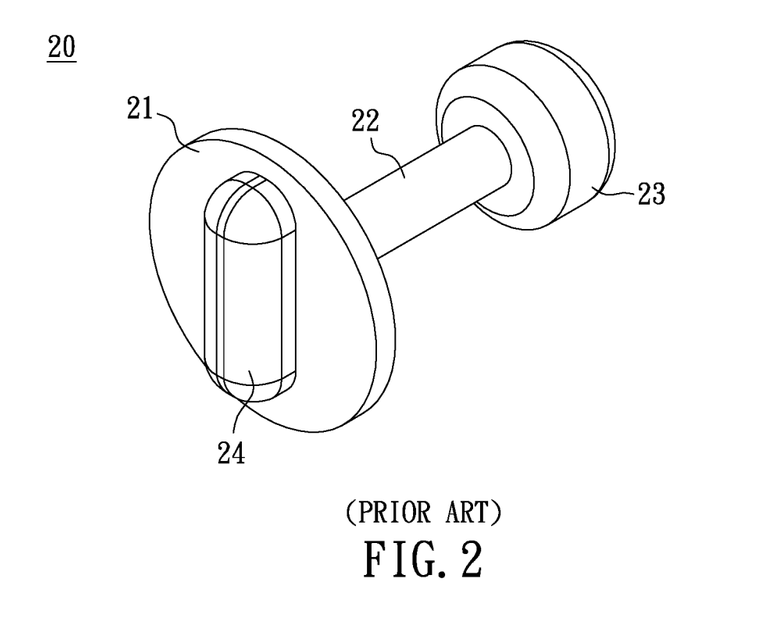
FIG. 2 (PRIOR ART) is a schematic view of a conventional rotary switch for use with a microwave oven.

In another example, a rotary switch for use with a microwave oven is configured for use in adjusting the magnitude of the heat of the microwave oven. Referring to FIG. 2, the rotary switch 20 comprises a body 21, a connection portion 22, a control unit 23, and a rotation head 24. The body 21 has therein a variable resistor. The body 21 is embeddedly disposed in microwave oven. The two ends of the connection portion 22 are connected to the body 21 and the control unit 23, respectively, to enable the body 21 to move together with the control unit 23. The rotation head 24 is disposed at the control unit 23 and positioned proximate to a user. The resistance produced by the body 21 varies as a result of the user's rotating the rotation head 24 to change the direction indicated by the rotation head 24; hence, the output current is adjusted according to the variable resistance. The operating state of the rotary switch 20 is determined according to the level of the current input to the body 21 by a related device disposed in the microwave oven, so as to adjust the magnitude of the heat generated.

However, regarding the aforesaid gas stove, if the pilot light of the ignition device 13 gets extinguished abnormally and the fuel gas flow rate controller 12 is not turned off immediately, a leak of the fuel gas may happen, thereby leading to an accident. Furthermore, in the above example of a microwave oven, the aforesaid resistive control inevitably generates an error and thus precludes precise control of the magnitude of the input current to the microwave oven. Moreover, after long use, the control unit 23 and the rotation head 24 are likely to end up in reduced precision or a failure.

SUMMARY OF THE INVENTION

It is an objective of the present invention to provide a rotary switch state detection device capable of locating a rotation head of a rotary switch according to gravity strength variations or magnetic field strength variations and thereby determining the state of the rotary switch.

In order to achieve the above and other objectives, the present invention provides a rotary switch state detection device, for detecting a state of a rotary switch having a rotation head, the state varying with a position of the rotation head, the rotary switch state detection device comprising: a gravity sensing unit disposed at the rotation head of the rotary switch to detect a gravity value and generate a gravity strength signal accordingly; and a processing unit connected to the gravity sensing unit to receive the gravity strength signal and calculate a gravity value variation, thereby locating the rotation head.

Regarding the rotary switch state detection device, the gravity strength signal is in the number of one, and rotation of the rotation head from an initial position to a first position causes the gravity sensing unit to detect a gravity value of the first position and generate the gravity strength signal accordingly such that the processing unit receives the gravity strength signal and calculates a difference between the gravity value of the first position and a standard gravity value, thereby determining the first position.

Regarding the rotary switch state detection device, the gravity strength signal is in the number of two, and the gravity sensing unit generates a first gravity strength signal when the rotation head is at a first position and generates a second gravity strength signal when the rotation head rotates from the first position to a second position such that the processing unit receives the first gravity strength signal and the second gravity strength signal and then calculates a gravity value variation, thereby determining the second position.

Regarding the rotary switch state detection device, the gravity sensing unit is a three-axis accelerometer.

Regarding the rotary switch state detection device, the rotary switch state detection device further comprises a magnetic field generating unit and a magnetic force sensing unit. The magnetic field generating unit is fixed in place to enclose the rotary switch and generate a magnetic field around the rotary switch. The magnetic force sensing unit is disposed at the rotary switch to detect a magnetic force value of the magnetic field and generate a magnetic field strength signal accordingly. The processing unit is connected to the magnetic force sensing unit to receive the magnetic field strength signal and calculate variations of the gravity value and the magnetic force value, thereby locating the rotation head.

Regarding the rotary switch state detection device, the rotary switch state detection device further comprises a signal output unit and a client host unit. The signal output unit is connected to the processing unit to send a state signal pertaining to the state of the rotary switch. The client host unit receives and sends the state signal to a cloud server for storage.

Regarding the rotary switch state detection device, the cloud server comprises a computation unit for determining whether the state of the rotary switch is abnormal.

Regarding the rotary switch state detection device, the cloud server comprises an alert message transmission unit for generating an alert message when the computation unit determines that the state of the rotary switch is abnormal.

Regarding the rotary switch state detection device, the state signal comprises angle variation data, and the computation unit calculates an angle variation to thereby determine whether the state of the rotary switch is abnormal.

In order to achieve the above and other objectives, the present invention provides a rotary switch state detection device, for detecting a state of a rotary switch having a rotation head, the state varying with a position of the rotation head, the rotary switch state detection device comprising a magnetic field generating unit, a magnetic force sensing unit and a processing unit.

The magnetic field generating unit is fixed in place to enclose the rotary switch and generate a magnetic field around the rotary switch. The magnetic force sensing unit is disposed at the rotary switch to detect a magnetic force value of the magnetic field and generate a magnetic field strength signal accordingly. The processing unit is connected to the magnetic force sensing unit to receive the magnetic field strength signal and calculate a magnetic force value variation, thereby locating the rotation head.

Regarding the rotary switch state detection device, the magnetic field strength signal is in the number of one, and rotation of the rotation head from an initial position to a first position causes the magnetic force sensing unit to detect a magnetic force value of the first position and generate the magnetic field strength signal accordingly such that the processing unit receives the magnetic field strength signal and calculates a difference between the magnetic force value of the first position and a standard magnetic force value, thereby determining the first position.

Regarding the rotary switch state detection device, the magnetic field strength signal is in the number of two, and the magnetic force sensing unit generates a first magnetic field strength signal when the rotation head is at a first position and generates a second magnetic field strength signal when the rotation head rotates from the first position to a second position such that the processing unit receives the first magnetic field strength signal and the second magnetic field strength signal and then calculates a magnetic force value variation, thereby determining the second position.

Regarding the rotary switch state detection device, the magnetic field generating unit comprises a magnet.

Regarding the rotary switch state detection device, the magnetic force sensing unit is a three-axis magnetometer.

Regarding the rotary switch state detection device, further comprises a signal output unit and a client host unit. The signal output unit connected to the processing unit to send a state signal pertaining to the state of the rotary switch. The client host unit is for receiving and sending the state signal to a cloud server for storage.

Regarding the rotary switch state detection device, the cloud server comprises a computation unit for determining whether the state of the rotary switch is abnormal.

Regarding the rotary switch state detection device, the cloud server comprises an alert message transmission unit for generating an alert message when the computation unit determines that the state of the rotary switch is abnormal.

Regarding the rotary switch state detection device, the state signal comprises angle variation data, and the computation unit calculates an angle variation to thereby determine whether the state of the rotary switch is abnormal.

According to the present invention, the rotary switch state detection device is equipped with a gravity sensing unit to thereby generate a gravity strength signal according to the variation in the position (for example, the pointing direction) of a rotation head, equipped with a magnetic field generating unit and a magnetic force sensing unit to thereby generate a magnetic field strength signal according to the variation in the position (for example, the pointing direction) of the rotation head, and equipped with a processing unit for locating the rotation head, so as to determine the state of the rotary switch precisely.

BRIEF DESCRIPTION OF THE DRAWINGS

Objectives, features, the advantages of the present invention are hereunder illustrated with specific embodiments in conjunction with the accompanying drawings, in which.

DETAILED DESCRIPTION OF THE PREFERRED EMBODIMENTS

Figure 3:
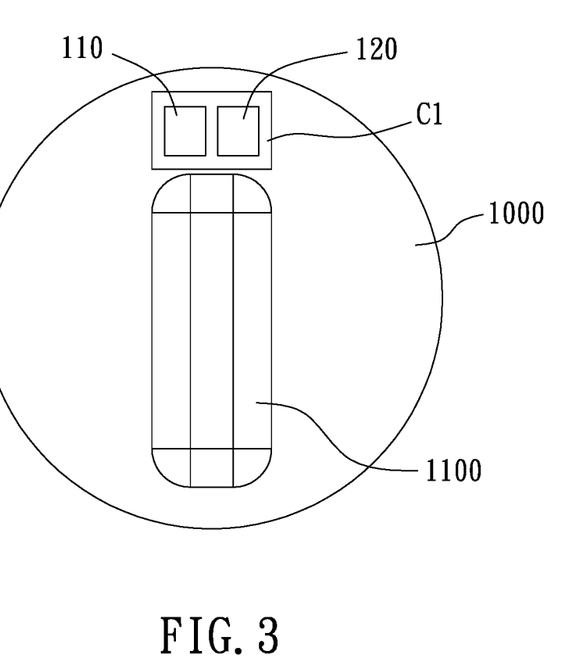
FIG. 3 is a schematic view of the first embodiment of a rotary switch state detection device and a rotary switch according to the present invention.

Referring to FIG. 3, there is shown a schematic view of a rotary switch 1000 whose state is detected with a rotary switch state detection device 100 of the first embodiment of the present invention. As shown in FIG. 3, the rotary switch state detection device 100 comprises a gravity sensing unit 110 and a processing unit 120.

The gravity sensing unit 110 is disposed at the rotary switch 1000. The gravity sensing unit 110 detects the gravity value and generates a gravity strength signal G accordingly. The gravity strength signal G is in the number of one or more.

The processing unit 120 is connected to the gravity sensing unit 110 to receive the gravity strength signal G. The connection between the processing unit 120 and the gravity sensing unit 110 is wired (for example, by a wire) or wireless. The gravity sensing unit 110 and the processing unit 120 are integrated into a chip C1 or together form a module.

When a rotation head 1100 of the rotary switch 1000 is rotated, the processing unit 120 calculates gravity value variations and thereby precisely locates the rotation head 1100 upon completion of rotation thereof. For example, if the rotation head 1100 has an initial position "pointing at 0 degree", the processing unit 120 calculates a gravity value variation and thus finds that the rotation head 1100 has a current position "pointing at 30 degrees" after the rotation head 1100 has been rotated.

Figure 4A:
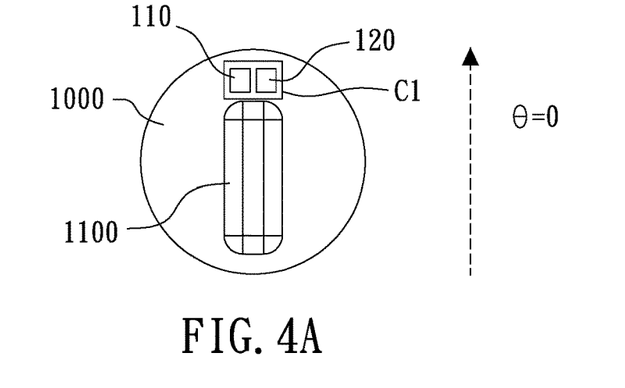
FIG. 4A through FIG. 4C are schematic views of operation of the first embodiment of the rotary switch state detection device operating in conjunction with a rotation head of the rotary switch according to the present invention.
Figure 4B:
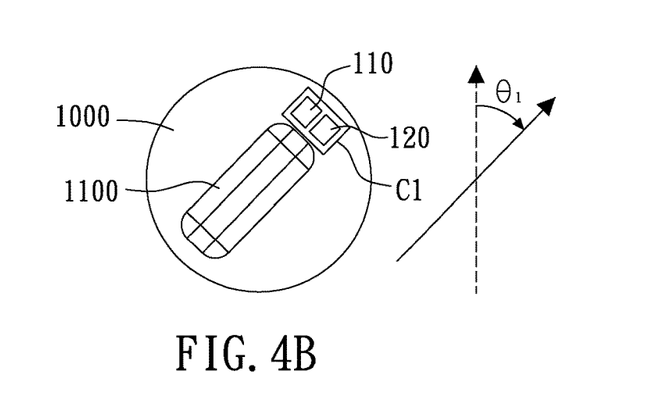

If the gravity strength signal G is in the number of one, the rotary switch state detection device 100 operates in a manner described below. Referring to FIG. 4A and FIG. 4B, when the rotation head 1100 rotates from an initial position P0 to a first position P1, the gravity sensing unit 110 detects a gravity value GV at the first position P1 and generates the gravity strength signal G accordingly. The processing unit 120 receives the gravity strength signal G, calculates the difference between the gravity value GV and a standard gravity value GV0 (by subtracting GV0 from GV1), treats the calculated difference as the gravity value variation, and determines the first position P1 according to the gravity value variation.

In this embodiment, if the rotation head 1100 is at the initial position P0 (as shown in 4A), the state of the rotary switch 1000 is OFF. If the rotation head 1100 is at the first position P1 (as shown in 4B), the state of the rotary switch 1000 is ON. The standard gravity value GV0 is the ideal gravity value of the rotary switch 1000 in an OFF state. The standard gravity value GV0 is predetermined in the processing unit 120.

Figure 4C:
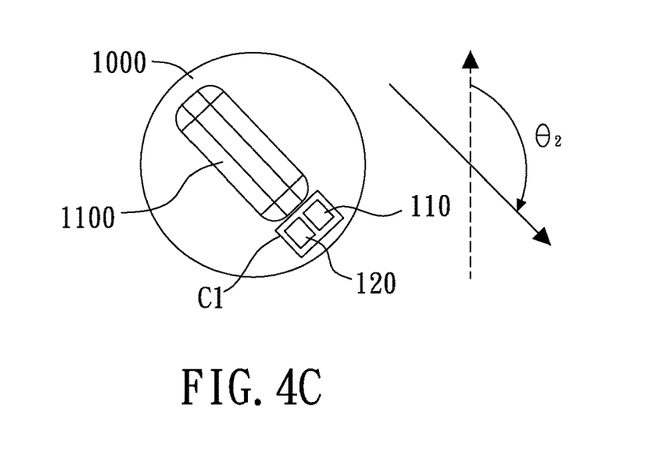

If the gravity strength signal G is in the number of two (denoted by G1, G2, respectively), the rotary switch state detection device 100 operates in a manner described below. Referring to FIG. 4B and FIG. 4C, when the rotation head 1100 is at a first position P1, the gravity sensing unit 110 detects a gravity value GV1 of the first position P1 and generates a first gravity strength signal G1 accordingly. When the rotation head 1100 rotates from the first position P1 to a second position P2, the gravity sensing unit 110 detects a gravity value GV2 of the second position P2 and generates a second gravity strength signal G2 accordingly. As a result, the processing unit 120 receives the first gravity strength signal G1 and the second gravity strength signal G2 and then calculates a gravity value variation (by subtracting GV1 from GV2) to determine the second position P2.

In this embodiment, if the rotation head 1100 is at the first position P1 (as shown in 4B), the state of the rotary switch 1000 is "slight ON"; meanwhile, the flame level of a related mechanical apparatus (such as a gas stove or microwave oven) must be set to "low heat" or "heating slightly". If the rotation head 1100 is at the second position P2 (as shown in 4C), the state of the rotary switch 1000 is "strong ON"; meanwhile, the flame level of a related mechanical apparatus (such as a gas stove or microwave oven) must be set to "high heat" or "heating strongly".

As shown by the aforesaid two examples, the rotary switch 1000 has two states (such as ON and OFF) or three states (such as strong ON, slight ON, and OFF) as needed, such that the user changes the position of the rotation head 1100 (for example, rotates the rotation head 1100 and thus changes the pointing angle) to effectuate two-step or multiple-step adjustment. The gravity value variation is the difference between two measured gravity values or between a measured gravity value and a standard gravity value, but the present invention is not limited thereto.

The gravity sensing unit 110 is preferably a three-axis accelerometer for effectuating detection in all directions. The processing unit 120 is preferably a microcontroller. The microcontroller has an algorithm for performing the aforesaid computational function.

Figure 5:
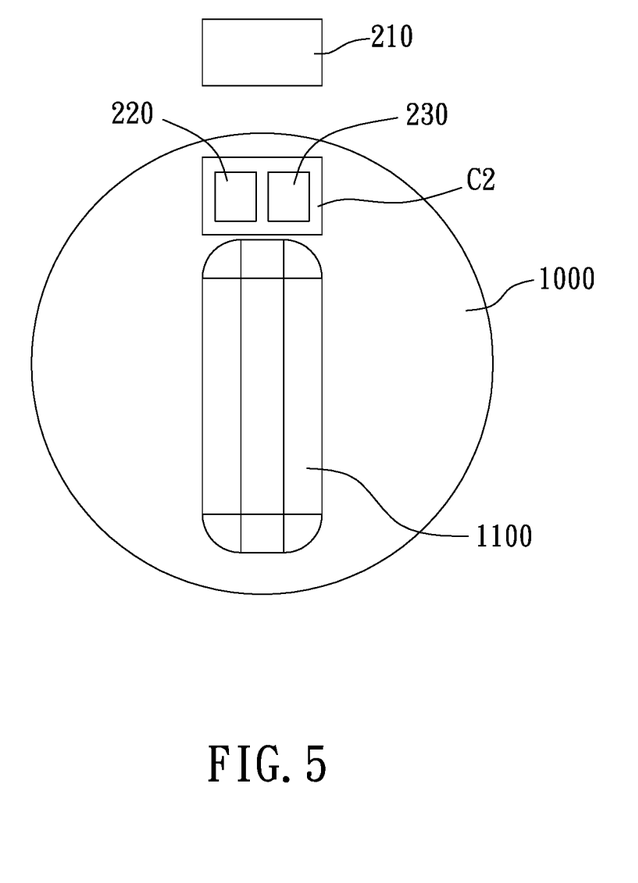
FIG. 5 is a schematic view of the second embodiment of the rotary switch state detection device and a rotary switch according to the present invention.

Referring to FIG. 5, there is shown a schematic view of the second embodiment of the rotary switch state detection device 200 and a rotary switch 1000' according to the present invention. As shown in FIG. 5, the rotary switch state detection device 200 comprises a magnetic field generating unit 210, a magnetic force sensing unit 220 and a processing unit 230.

The magnetic field generating unit 210 is fixed in place to enclose the rotary switch 1000' and thereby generate magnetic field round the rotary switch 1000'. The magnetic field generating unit 210 comprises a magnet.

The magnetic force sensing unit 220 is disposed at the rotary switch 1000'. The magnetic force sensing unit 220 detects the magnetic force value of the magnetic field and generates a magnetic field strength signal M accordingly. The magnetic field strength signal M is in the number of one or more.

The processing unit 230 is connected to the magnetic force sensing unit 220 to receive the magnetic field strength signal M. The connection between the processing unit 230 and the magnetic force sensing unit 220 is wired (for example, by a wire) or wireless. The processing unit 230 and the magnetic force sensing unit 220 are integrated into a chip C2 or together form a module.

Hence, when a rotation head 1100' of the rotary switch 1000' is rotated, the processing unit 230 calculates a magnetic force value variation to precisely determine the position of the rotation head 1100' upon completion of rotation thereof. For example, if the rotation head 1100' has an initial position "pointing at 0 degrees", the processing unit 230 calculates a magnetic force value variation and thus finds that the rotation head 1100' has a current position "pointing at 30 degrees" after the rotation head 1100' has been rotated.

Figure 6A:
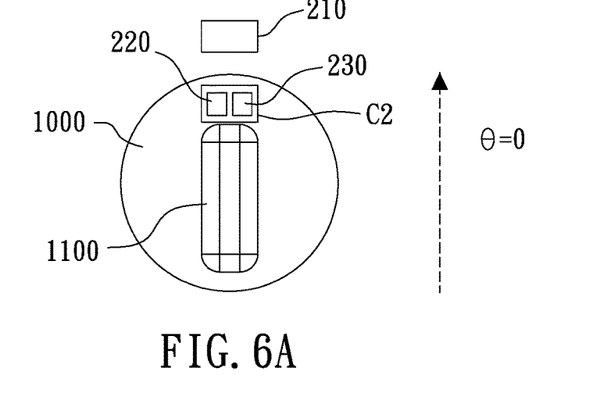
FIG. 6A through FIG. 6C are schematic views of operation of the second embodiment of the rotary switch state detection device operating in conjunction with the rotation head of the rotary switch according to the present invention.
Figure 6B:
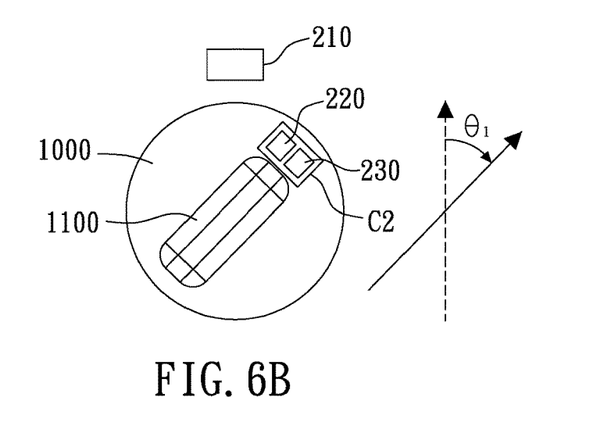

If the magnetic field strength signal M is in the number of one, the rotary switch state detection device 200 operates in a manner described below. Referring to FIG. 6A and FIG. 6B, when the rotation head 1100' rotates from an initial position P0' to a first position P1', the magnetic force sensing unit 220 detects the magnetic force value MV of the magnetic field and generates the magnetic field strength signal M accordingly. Afterward, the processing unit 230 receives the magnetic field strength signal M, calculates the difference between the magnetic force value MV and a standard magnetic force value MV0 (by subtracting MV0 from MV), treats the calculated difference as the magnetic force value variation, and determines the first position P1' according to the magnetic force value variation.

In this embodiment, if the rotation head 1100' is at the initial position P0' (as shown in 6A), the state of the rotary switch 1000' is OFF. If the rotation head 1100' is at the first position P1' (as shown in 6B), the state of the rotary switch 1000' is ON. The standard magnetic force value MV0 is the ideal magnetic force value of the rotary switch 1000' in an OFF state. The standard magnetic force value MV0 is predetermined in the processing unit 230.

Figure 6C:
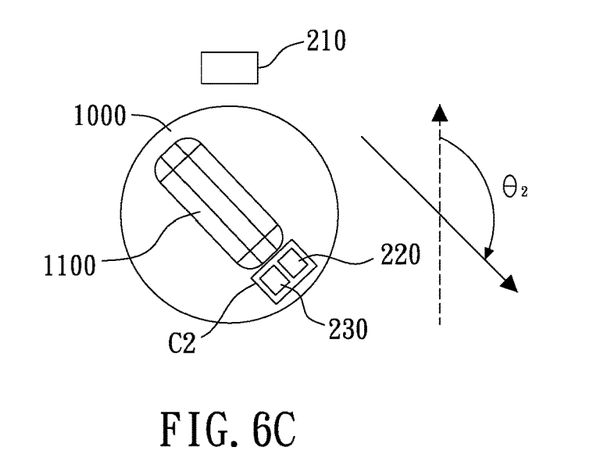

If the magnetic field strength signal M is in the number of two (denoted by M1, M2, respectively), the rotary switch state detection device 200 operates in a manner described below. Referring to FIG. 6B and FIG. 6C, when the rotation head 1100' is at a first position P1', the magnetic force sensing unit 220 detects a magnetic force value MV1 of the first position P1' and generates a first magnetic field strength signal M1 accordingly. When the rotation head 1100' rotates from the first position P1' to a second position P2', the magnetic force sensing unit 220 detects a magnetic force value MV2 of the second position P2' and generates a second magnetic field strength signal M2 accordingly. As a result, the processing unit 230 receives the first magnetic field strength signal M1 and the second magnetic field strength signal M2 and then calculates a magnetic force value variation (by subtracting MV1 from MV2) to determine the second position P2'.

In this embodiment, if the rotation head 1100' is at the first position P1' (as shown in 6B), the state of the rotary switch 1000' is "slight ON"; meanwhile, the flame level of a related mechanical apparatus (such as a gas stove or microwave oven) must be set to "low heat" or "heating slightly". If the rotation head 1100' is at the second position P2' (as shown in 6C), the state of the rotary switch 1000' is "strong ON"; meanwhile, the flame level of a related mechanical apparatus (such as a gas stove or microwave oven) must be set to "high heat" or "heating strongly".

As shown by the aforesaid two examples, the rotary switch 1000' has two states (such as ON and OFF) or three states (such as strong ON, slight ON, and OFF) as needed, such that the user changes the position of the rotation head 1100' (for example, rotates the rotation head 1100' and thus changes the pointing angle) to effectuate two-step or multiple-step adjustment. The magnetic force value variation is the difference between two measured magnetic force values or between a measured magnetic force value and a standard magnetic force value, but the present invention is not limited thereto.

The magnetic force sensing unit 220 is preferably a three-axis magnetometer for effectuating detection in all directions. The processing unit 230 is preferably a microcontroller. The microcontroller has an algorithm for performing the aforesaid computational function.

Figure 7:
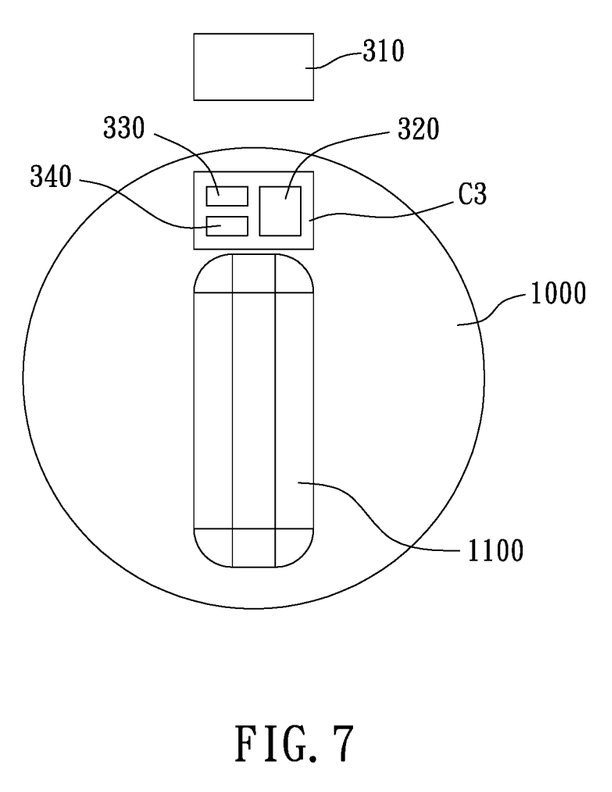
FIG. 7 is a schematic view of the third embodiment of the rotary switch state detection device and a rotary switch according to the present invention.

Referring to FIG. 7, there is shown a schematic view of the third embodiment of the rotary switch state detection device 300 and a rotary switch 1000" according to the present invention. As shown in FIG. 7, the rotary switch state detection device 300 comprises a magnetic field generating unit 310, a gravity sensing unit 320, a magnetic force sensing unit 330 and a processing unit 340.

The magnetic field generating unit 310 is fixed in place to enclose the rotary switch 1000" and thereby generate magnetic field round the rotary switch 1000". The magnetic field generating unit 310 comprises a magnet.

The gravity sensing unit 320 and the magnetic force sensing unit 330 are disposed at the rotary switch 1000". The gravity sensing unit 320 detects the gravity value and generates a gravity strength signal G accordingly. The gravity strength signal G is in the number of one or more. The magnetic force sensing unit 330 detects the magnetic force value of the magnetic field and generates a magnetic field strength signal M. The magnetic field strength signal M is in the number of one or more. Preferably, the gravity strength signal G equals or corresponds to the magnetic field strength signal M in quantity.

The processing unit 340 is connected to the gravity sensing unit 320 and the magnetic force sensing unit 330 to receive the gravity strength signal G and the magnetic field strength signal M. The connection between the processing unit 340 and the gravity sensing unit 320 is wired (for example, by a wire) or wireless. The connection between the processing unit 340 and the magnetic force sensing unit 330 is wired (for example, by a wire) or wireless. The gravity sensing unit 320, the magnetic force sensing unit 330 and the processing unit 340 are integrated into a chip C3 or together form a module.

Hence, when the rotation head 1100" of the rotary switch 1000" is rotated, the processing unit 340 calculates a gravity value variation and a magnetic force value variation to precisely determine the position of the rotation head 1100" upon completion of rotation thereof. For example, if the rotation head 1100" has an initial position "pointing at 0 degrees," the processing unit 340 calculates a gravity value variation and a magnetic force value variation and thus finds that the rotation head 1100' has a current position "pointing at 30 degrees" after the rotation head 1100" has been rotated.

Unlike the first and second embodiments, the third embodiment gives considerations to the variations of both the gravity value and magnetic force value in the course of locating the rotation head 1100", the third embodiment yields a more accurate locating result than the first embodiment and second embodiment.

The rotary switch state detection devices 100, 200, 300 in the first through third embodiments have their respective applications. The rotary switch state detection device 100 works well with the rotary switch disposed beside a mechanical apparatus, because the plane of rotation of the rotation head is substantially perpendicular to the ground. The rotary switch state detection device 200 works well with the rotary switch which rests on a mechanical apparatus, because the plane of rotation of the rotation head is substantially parallel to the ground. The rotary switch state detection device 300 works well with the rotary switch which is neither beside nor on a mechanical apparatus.

Furthermore, the rotary switch state detection device 300 works well with the rotary switch 1000 whose position relative to a mechanical apparatus is unknown. In this situation, the processing unit 340 determines the position of the rotary switch 1000 relative to the mechanical apparatus according to a gravity value variation or a gravity value variation. If the processing unit 340 determines that the rotary switch is beside the mechanical apparatus, the processing unit 340 will locate the rotation head according to a gravity value variation only. If the processing unit 340 determines that the rotary switch is on the mechanical apparatus, the processing unit 340 will locate the rotation head according to a magnetic force value variation only. If the processing unit 340 determines that the rotary switch is neither beside nor on the mechanical apparatus, the processing unit 340 will locate the rotation head according to the variations of both a gravity value and a magnetic force value.

Figure 8A:
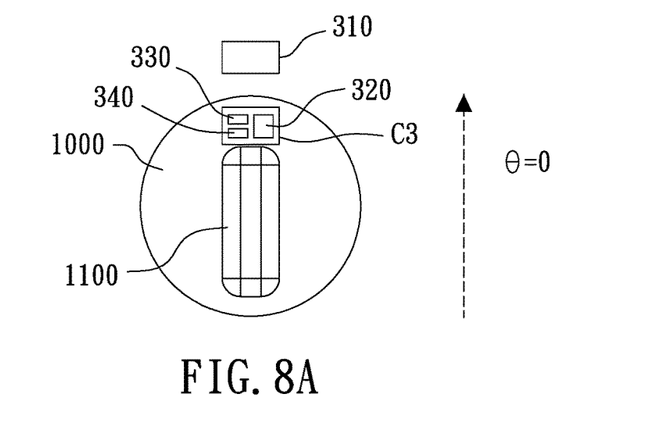
FIG. 8A through FIG. 8C are schematic views of operation of the third embodiment of the rotary switch state detection device operating in conjunction with the rotation head of the rotary switch according to the present invention.
Figure 8B:
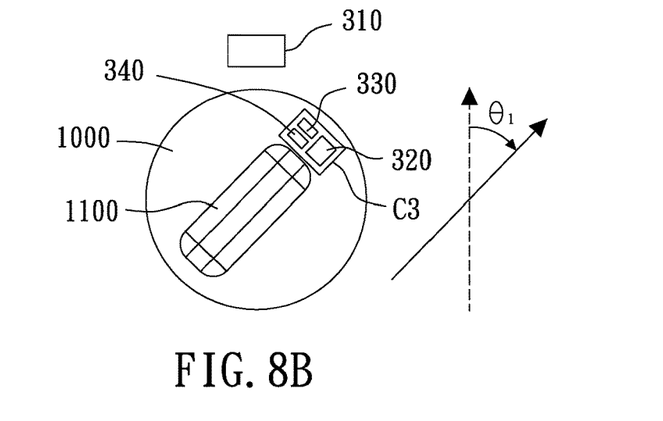
Figure 8C:
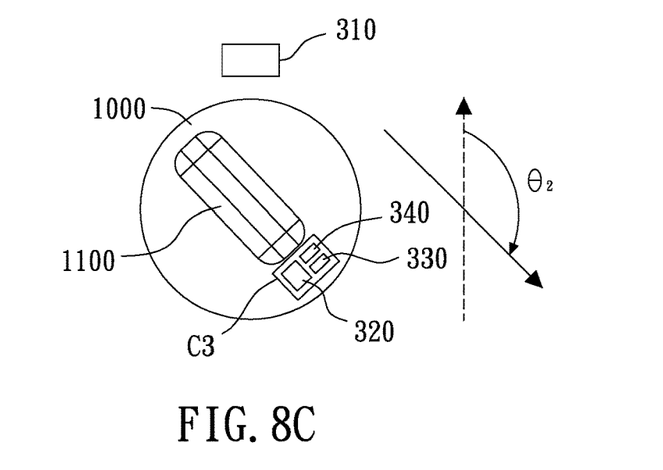

FIG. 8A through FIG. 8C, there are shown schematic views of variations in an initial position P0", a first position P1" and a second position P2" of the rotary switch state detection device 300. Its underlying principle is similar to that of FIG. 4A~FIG. 4C and FIG. 6A~FIG. 6C and thus is not reiterated herein for the sake of brevity.

Figure 9:
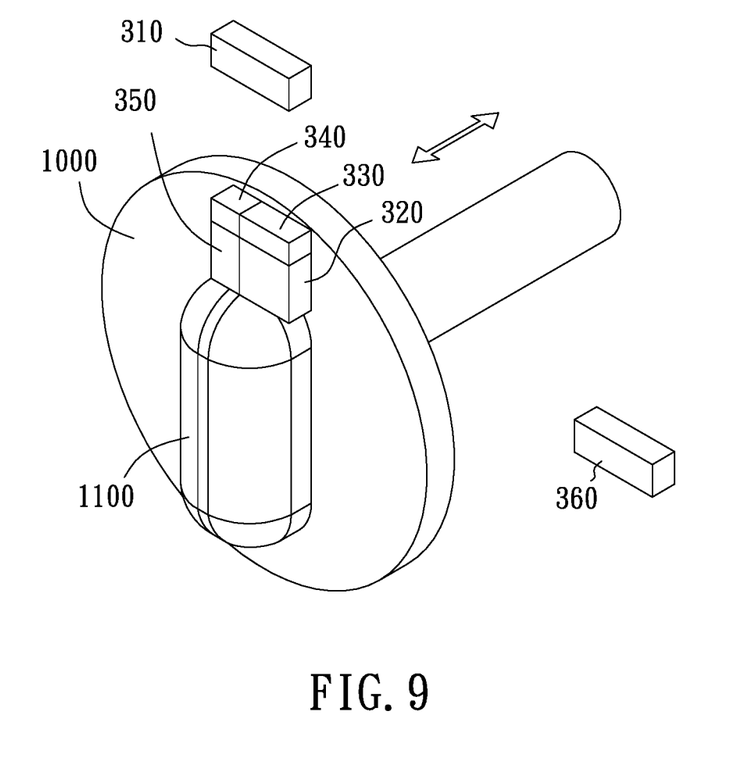
FIG. 9 is a schematic view of the fourth embodiment of the rotary switch state detection device and the rotary switch according to the present invention.
Figure 10:
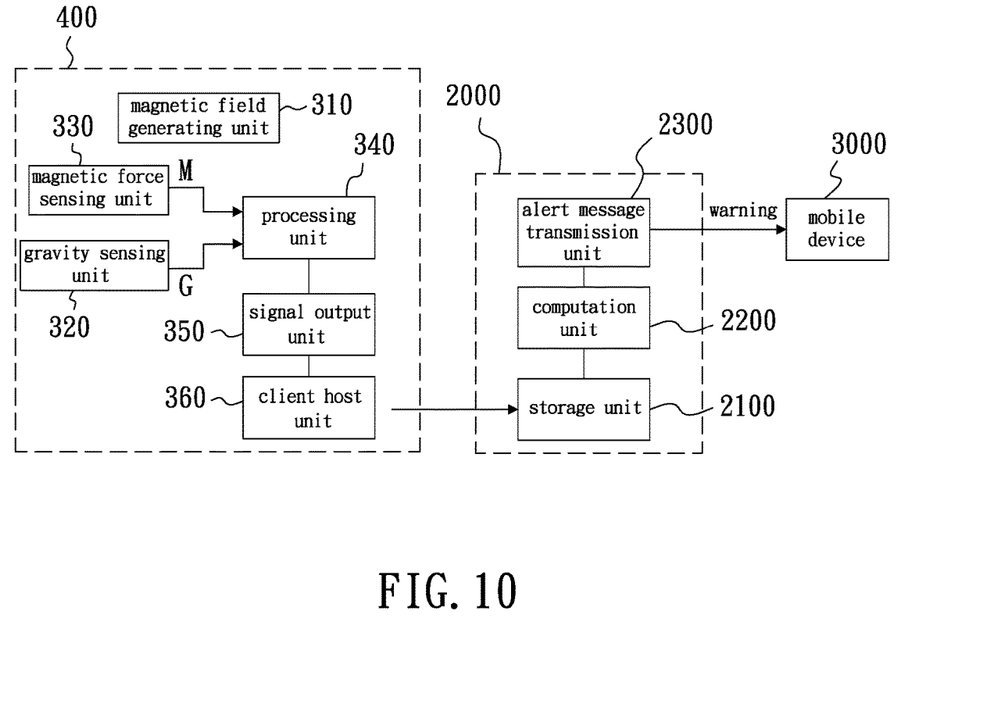
FIG. 10 is a block diagram of the fourth embodiment of the rotary switch state detection device and a cloud server according to the present invention.

FIG. 9 is a schematic view of the fourth embodiment of the rotary switch state detection device 400 and a rotary switch according to the present invention. FIG. 10 is a block diagram of the fourth embodiment of the rotary switch state detection device 400 and a cloud server according to the present invention.

Referring to FIG. 9 and FIG. 10, the components of the rotary switch state detection device 400 are substantially identical to the components of the rotary switch state detection device 300, wherein the rotary switch state detection device 400 further comprises a signal output unit 350 and a client host unit 360. The signal output unit 350 is connected to the processing unit 340. The signal output unit 340 sends a state signal S pertaining to the state of the rotary switch

1000". The client host unit 360 receives the state signal S and sends the state signal S to a cloud server 2000 for storage.

The gravity sensing unit 320, the magnetic force sensing unit 330, the processing unit 340 and the signal output unit 350 are integrated into a chip C4 or together form a module.

The signal output unit 350 is provided in the form of a radio frequency (RF) circuit and an antenna. The state signal S is in the number of one or more. When provided in a plural number, the state signals S are indicative of the states of the rotary switch 1000" in different points in time. For instance, the state signal S from the signal output unit 350 indicates "largely ON" when sent between 09:00 and 09:05, "slightly ON" when between 09:05 and 09:15, and "OFF" when after 09:15.

In a variant embodiment of the present invention, the state signal S relates to angle variation data. For instance, the state signal S from the signal output unit 350 indicates "rotation +180 degrees" when sent at 09:00, "rotation −120 degrees" when at 09:05, and "rotation −60 degrees" when at 09:15 such that the cloud server 2000 calculates angle variations by itself to identify the latest state of the rotary switch 1000". In a variant embodiment of the present invention, the state signal S relates to any data other than angle data.

The cloud server 2000 comprises a storage unit 2100 for storing the state signal S to identify the variations in the state of the rotary switch 1000" at a specific point in time or within a time period, so as to facilitate subsequent data analysis, data enquiry, and the like.

The cloud server 2000 further comprises a computation unit 2200. The computation unit 2200 determines whether the state of the rotary switch 1000" is abnormal according to the state signal S. For instance, when an ignition device of a gas stove has its flame gone abnormally and the rotary switch 1000" is not off, the computation unit 2200 will determine that the state of the rotary switch 1000" is abnormal.

The cloud server 2000 further comprises an alert message transmission unit 2300. The alert message transmission unit 2300 is connected to the computation unit 2200. If the computation unit 2200 determines that the state of the rotary switch 1000" is abnormal, the alert message transmission unit 2300 sends an alert message to the user's mobile device 3000 (such as a cellular phone) to remind the user of the abnormal state, thereby enhancing home safety.

With a mobile device interface, the user configures the normal state of the rotary switch 1000, say being ON for 10 minutes. If the computation unit 2200 determines that the rotary switch 1000" has been ON for more than 10 minutes, it means that the rotary switch 1000" was turned off abnormally and the current state of the rotary switch 1000" is abnormal. In response to this, the cloud server 2000 uses the alert message transmission unit 2300 to send an alert message to the user's mobile device 3000 to remind the user (such as a landlord) of the abnormal state.

For the sake of brevity, an embodiment is omitted herein. In the omitted embodiment, the rotary switch state detection device comprises the gravity sensing unit, the signal output unit and the client host unit but not the magnetic force generates unit and the magnetic force sensing unit.

For the sake of brevity, another embodiment is omitted herein. In the omitted embodiment, the rotary switch state detection device comprises the magnetic force generates unit, the magnetic force sensing unit, the signal output unit and the client host unit but not the gravity sensing unit.

Hence, even in any other embodiment, the rotary switch state detection device calculates just one of the gravity value variation and the magnetic force value variation, and the rotary switch state detection device still sends the state signal to the cloud server to determine whether the state of the rotary switch is abnormal. If it is determined that the state of the rotary switch is abnormal, the alert message will remind the user (such as a landlord) of the abnormal state of the rotary switch, thereby enhancing home safety.

According to the present invention, the rotary switch state detection device is equipped with a gravity sensing unit to thereby generate a gravity strength signal according to the variation in the position of a rotation head, equipped with a magnetic field generating unit and a magnetic force sensing unit to thereby generate a magnetic field strength signal according to the variation in the position of the rotation head, and equipped with a processing unit for locating the rotation head, so as to determine the state of the rotary switch precisely.

The present invention is disclosed above by preferred embodiments. However, persons skilled in the art should understand that the preferred embodiments are illustrative of the present invention only, but should not be interpreted as restrictive of the scope of the present invention. Hence, all equivalent changes and replacements made to the aforesaid embodiments should fall within the scope of the present invention. Accordingly, the legal protection for the present invention should be defined by the appended claims.

What is claimed is:

1. A rotary switch state detection device, for detecting a state of a rotary switch having a rotation head, the state varying with a position of the rotation head, the rotary switch state detection device comprising:
   a gravity sensing unit disposed at the rotation head of the rotary switch to detect a gravity value and generate a gravity strength signal accordingly; and
   a processing unit connected to the gravity sensing unit to receive the gravity strength signal and calculate a gravity value variation, thereby locating the rotation head.

2. The rotary switch state detection device of claim 1, wherein the gravity strength signal is in a number of one, and rotation of the rotation head from an initial position to a first position causes the gravity sensing unit to detect a gravity value of the first position and generate the gravity strength signal accordingly such that the processing unit receives the gravity strength signal and calculates a difference between the gravity value of the first position and a standard gravity value, thereby determining the first position.

3. The rotary switch state detection device of claim 1, wherein the gravity strength signal is in a number of two, and the gravity sensing unit generates a first gravity strength signal when the rotation head is at a first position and generates a second gravity strength signal when the rotation head rotates from the first position to a second position such that the processing unit receives the first gravity strength signal and the second gravity strength signal and then calculates a gravity value variation, thereby determining the second position.

4. The rotary switch state detection device of claim 1, wherein the gravity sensing unit is a three-axis accelerometer.

5. The rotary switch state detection device of claim 1, wherein the rotary switch state detection device further comprises:
   a magnetic field generating unit fixed in place to enclose the rotary switch and generate a magnetic field around the rotary switch; and a magnetic force sensing unit disposed at the rotary switch to detect a magnetic force value of the magnetic field and generate a magnetic field strength signal accordingly;

wherein the processing unit is connected to the magnetic force sensing unit to receive the magnetic field strength signal and calculate variations of the gravity value and the magnetic force value, thereby locating the rotation head.

6. The rotary switch state detection device of claim 1, further comprising:

a signal output unit connected to the processing unit to send a state signal pertaining to the state of the rotary switch; and a client host unit for receiving and sending the state signal to a cloud server for storage.

7. The rotary switch state detection device of claim 6, wherein the cloud server comprises a computation unit for determining whether the state of the rotary switch is abnormal.

8. The rotary switch state detection device of claim 7, wherein the cloud server comprises an alert message transmission unit for generating an alert message when the computation unit determines that the state of the rotary switch is abnormal.

9. The rotary switch state detection device of claim 8, wherein the state signal comprises angle variation data, and the computation unit calculates an angle variation to thereby determine whether the state of the rotary switch is abnormal.

* * * * *